(12) United States Patent
Bedeschi et al.

(10) Patent No.: US 7,848,138 B2
(45) Date of Patent: Dec. 7, 2010

(54) BIASING A PHASE CHANGE MEMORY DEVICE

(75) Inventors: Ferdinando Bedeschi, Biassono (IT); Richard E. Fackenthal, Carmichael, CA (US); Andrea Fantini, Derovere (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/809,702

(22) Filed: Jun. 1, 2007

(65) Prior Publication Data

US 2008/0298122 A1 Dec. 4, 2008

(51) Int. Cl.
*G11C 11/00* (2006.01)

(52) U.S. Cl. .................. 365/163; 365/148; 365/158; 257/2; 257/5; 257/52

(58) Field of Classification Search .......... 365/163, 365/148, 158; 257/2, 5, 52
See application file for complete search history.

(56) References Cited

U.S. PATENT DOCUMENTS

| | | | |
|---|---|---|---|
| 6,795,338 B2 * | 9/2004 | Parkinson et al. | 365/163 |
| 6,914,255 B2 * | 7/2005 | Lowrey | 257/5 |
| 7,233,054 B1 * | 6/2007 | Anh et al. | 257/613 |
| 7,394,684 B2 * | 7/2008 | Inokuchi et al. | 365/158 |
| 7,471,554 B2 * | 12/2008 | Spall et al. | 365/163 |
| 2004/0113137 A1 * | 6/2004 | Lowrey | 257/5 |
| 2006/0056234 A1 * | 3/2006 | Lowrey | 365/163 |

FOREIGN PATENT DOCUMENTS

| | | |
|---|---|---|
| WO | 2005/017904 | 2/2005 |
| WO | 2005/017907 | 2/2005 |
| WO | 2006/078506 | 7/2006 |

OTHER PUBLICATIONS

Korean Patent Office, International Search and Written Opinion for International Application No. PCT/US2008/054197, 10 Pages, Oct. 22, 2008.

Kinam Kim and Su Jin Ahn, "Reliability Investigations for Manufacturable High Density PRAM", IEEE 43rd Annual International Reliability Physics Symposium, pp. 157-162, Apr. 17-21, 2005.

* cited by examiner

*Primary Examiner*—Hoai V Ho
*Assistant Examiner*—Kretelia Graham
(74) *Attorney, Agent, or Firm*—Trop, Pruner & Hu, P.C.

(57) ABSTRACT

A phase change memory device includes a plurality of cells connected to bitlines and including respective phase change memory elements and cell select devices and an addressing circuit for selectively addressing at least one bitline and one cell connected thereto. A reading column bias circuit supplies a bitline voltage to the addressed bitline and cell. The bitline voltage includes the sum of a safe voltage and a reference select device voltage, wherein the reference voltage is equal to a select device voltage on the select device when a cell current flowing through the phase change memory element and the cell select device is equal to a safe current. The safe voltage and the safe current are such that phase transition of the phase change memory element is prevented in any bias condition including a cell voltage lower than the safe voltage and in any bias condition including the cell current lower than the safe current.

19 Claims, 4 Drawing Sheets

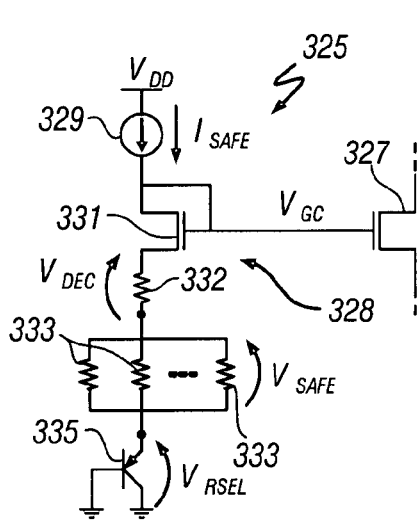
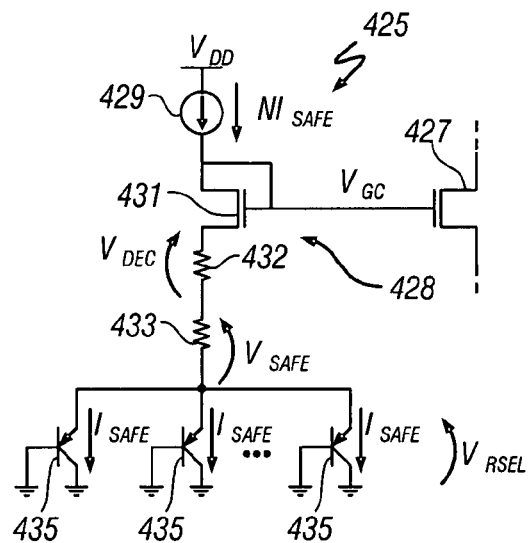
FIG. 6  FIG. 7
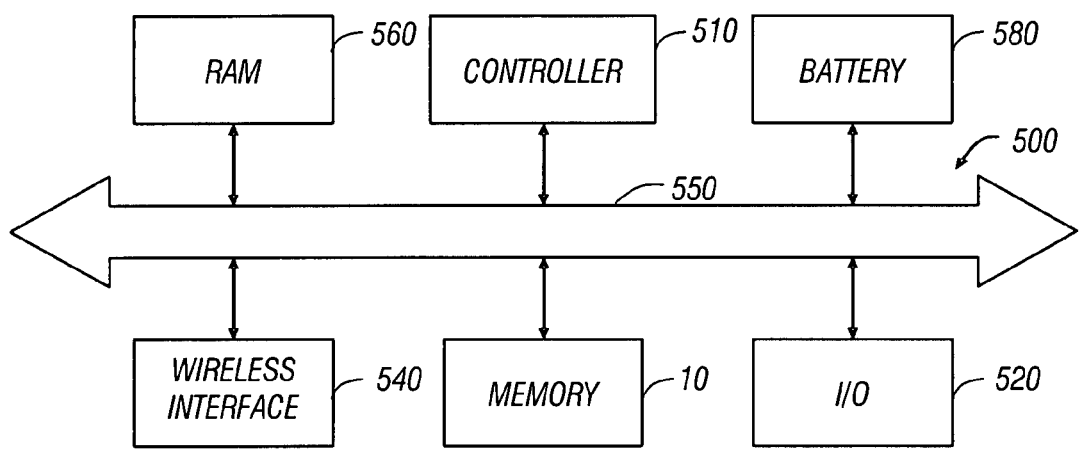
FIG. 8

BIASING A PHASE CHANGE MEMORY DEVICE

BACKGROUND

This relates generally to a phase change memory device.

Phase change memory arrays use a class of materials which have the property of changing between two phases having distinct electrical characteristics. For example, these materials may change from an amorphous phase, which is disorderly, to a crystalline or polycrystalline phase, which is orderly, and the two phases are associated with considerably different values of resistivity.

At present, alloys of elements of group VI of the periodic table, such as Te or Se, referred to as chalcogenides or chalcogenic materials, can advantageously be used in phase change cells. The chalcogenide that currently offers the most promise is formed by a Ge, Sb and Te alloy (Ge2Sb2Te5), referred to as GST.

In chalcogenides, the resistivity varies by two or more orders of magnitude when the material passes from the amorphous phase (more resistive) to the crystalline phase (more conductive) and vice versa.

BRIEF DESCRIPTION OF THE DRAWINGS

FIG. 6 is a circuit diagram of a portion of a phase change memory device according to a fourth embodiment of the present invention;

FIG. 7 is a circuit diagram of a portion of a phase change memory device according to a fifth embodiment of the present invention; and FIG. 8 is a system depiction of one embodiment of the present invention.

DETAILED DESCRIPTION

Figure 1:
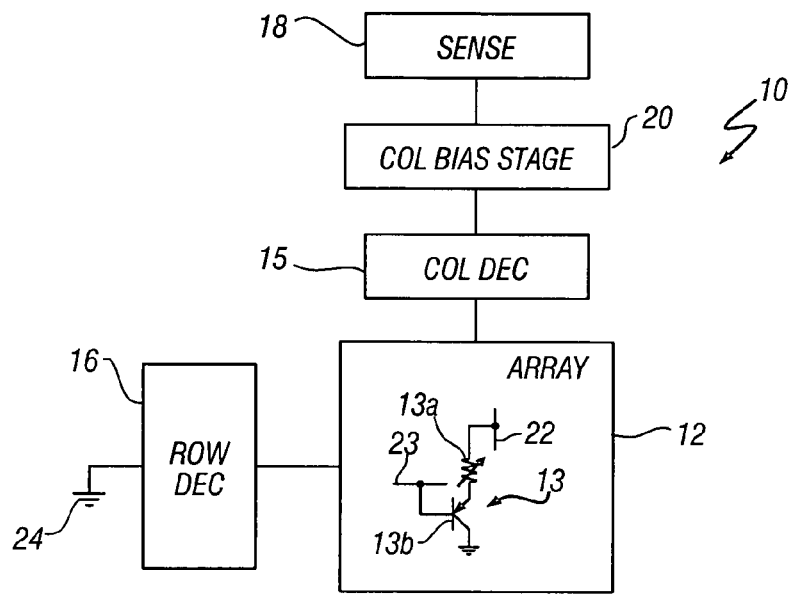
FIG. 1 shows a simplified block diagram of a phase change memory device according to a first embodiment of the present invention.

With reference to FIG. 1, a phase change memory device 10 comprises an array 12 of cells 13, that are arranged in rows and columns, a column decoder 15, a row decoder 16, a sense stage 18 and a reading column bias stage 20.

FIG. 1 illustrates a typical cell 13 of the array 12. A cell 13 includes a phase change memory element 13a and a select device 13b coupled in series. The phase change memory element 13a includes a portion of a phase change material and is therefore suitable for storing data in form of respective resistance levels associated to different phases of the phase change material, as above explained. In FIG. 1, the phase change memory element 13a is illustrated as a resistor having variable resistance level.

In one embodiment, the select device 13b are PNP bipolar transistors controlled to allow currents flow through selected memory elements 13a during read and program/verify operations. The cells 13 are further connected to respective bitlines 22 (directly) and word lines 23 (through the select device 13b). For the sake of simplicity, moreover, in the embodiment described, the cells 13 allow two different programmable resistance levels, to store one bit each. However, in other embodiments, multilevel cells, capable of storing more than one bit each, may be used.

Groups of cells 13 are selectively addressable by the column decoder 15 and the row decoder 16, which connect selected bitlines 22 to the reading column bias stage 20 and selected word lines 23 to a ground line 24, respectively. In the embodiment described, the ground line 24 is used as a read voltage supply line for the selected word lines 23.

Figure 2:
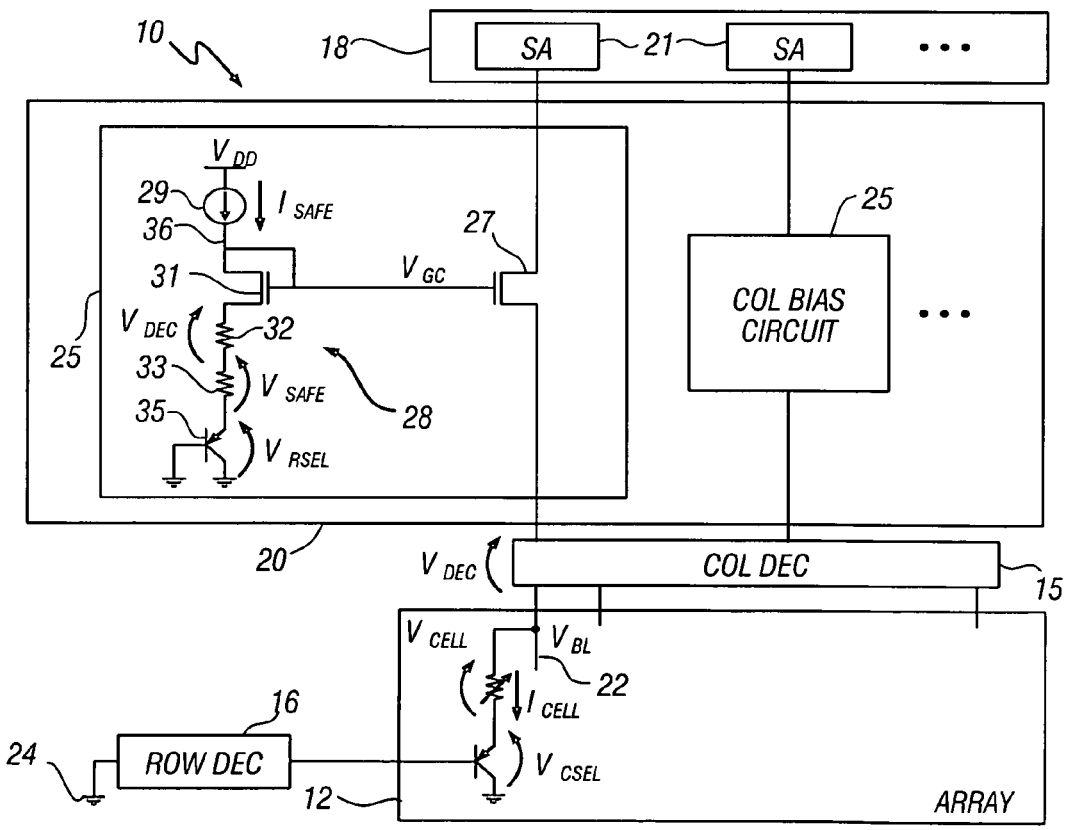
FIG. 2 is a hybrid circuit and block diagram of the phase change memory device of FIG. 1.

The addressed cells 13 are read by the sense stage 18. As illustrated in FIG. 2, the sense stage 18 comprises a plurality of sense amplifiers 21, connectable to respective addressed bitlines 22 via the column decoder 15.

The reading column bias stage 20 comprises a plurality of reading column bias circuits 25, each coupled to a respective sense amplifier 21 for biasing bitlines 22 selected for reading. FIG. 2 shows a simplified circuit diagram of one of the reading column bias circuits 25.

Each reading column bias circuit 25 comprises a cascode transistor 27 and a voltage control circuit 28, for providing a controlled bias voltage $V_{GC}$ on a gate terminal of the cascode transistor 27. In one embodiment, the cascode transistor 27 is a NMOS transistor and has its drain terminal connected to a respective sense amplifier 21 and source terminal connected to the column decoder 15 for coupling with an addressed bitline 22.

The voltage control circuit 28 comprises a current source 29, a diode-connected bias transistor 31, a dummy resistor 32, a reference resistor 33 and a reference selector 35, all of which are series-connected.

Figure 3:
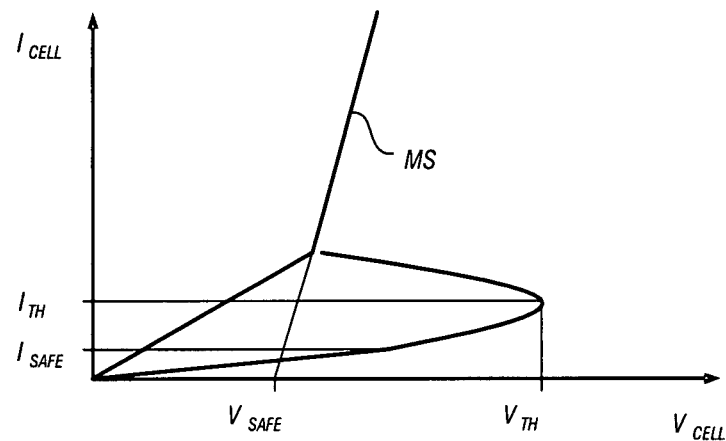
FIG. 3 is a plot of a I-V characteristic of a PCM cell of the phase change memory device of FIG. 1.

The current source 29 is connected to a voltage supply line 36 and is configured to supply the bias transistor 31, the dummy resistor 32, the reference resistor 33 and the reference selector 35 with a controlled safe current $I_{SAFE}$. The safe current $I_{SAFE}$ is selected so that if a read cell current $I_{CELL}$, that flows through an addressed cell 13 during reading operation, is lower than the safe current $I_{SAFE}$, a read disturb is avoided, whatever read cell voltage $V_{CELL}$ is dropped by the phase change memory element 13a of the addressed cells 13. As illustrated in FIG. 3, the current values above the safe current $I_{SAFE}$ in the I-V characteristic of a cell 13 in the amorphous state shows non-linearity. In particular, phase transition of the phase change memory element 13a is prevented in any bias condition such that the read cell current $I_{CELL}$ is lower than the safe current $I_{SAFE}$, irrespective of the resistance level of the addressed cells 13.

The bias transistor 31 may be an NMOS transistor designed to match the cascode transistor 27. The gate terminal of the bias transistor 31 may provide the bias voltage $V_{GC}$ and is directly connected to the gate terminal of the cascode transistor 27.

The resistor 33 may conveniently be made of the same phase change material as the phase change memory elements 13a of the cells 13 (e.g. GST). In one embodiment, the phase change material forming the resistor 33 is in its crystalline state. A resistance value of the reference resistor 33 is such that a predetermined safe voltage $V_{SAFE}$ is dropped across the resistor 33 when the current source 29 supplies the safe current $I_{SAFE}$. The safe voltage $V_{SAFE}$ is in turn selected so that if the read cell voltage $V_{CELL}$ that is dropped across the phase change memory element 13a of addressed cells 13 during reading operation, is lower than the safe voltage $V_{SAFE}$, reading is not affected by disturbs, whatever the read cell current $I_{CELL}$ flowing through the addressed cells 13.

With reference again to FIG. 3, the safe voltage $V_{SAFE}$ is the voltage value at which the voltage axis is intercepted by virtually extending a melt-state section MS of the I-V characteristic of a cell 13. In particular, phase transition of the phase change memory element 13a is prevented in any bias condition such that the read cell voltage $V_{CELL}$ is lower than the safe voltage $V_{SAFE}$, irrespective of the resistance level of the addressed cells 13.

The dummy resistor 32 is sized to balance the decoding voltage $V_{DEC}$ on the column decoder 15 and may be formed by as many series connected dummy transistors (not shown) as these may be in the decoding levels of the column decoder 15.

The reference select device 35 may be a bipolar PNP transistor identical to cell select devices 13b of the cells 13. Base and collector terminals of the reference selector 35 are connected to the ground line 24 and the emitter terminal is connected to the reference resistor 33, so that the reference select device 35 and the cell select devices 13b of the selected cells 13 are in the same configuration (in practice, they are diode-connected).

Thus, when the safe current $I_{SAFE}$ flows through the voltage control circuit 28, the bias voltage $V_{GC}$ on the gate terminals of the bias transistor 31 and of the cascode transistor 27 is:

$$V_{GC} = V_{RSEL} + V_{SAFE} + V_{DEC} + V_{TN} + V_{OV} \quad (1)$$

where $V_{RSEL}$ is the voltage on the reference select device 31, $V_{TN}$ is a threshold voltage of the bias transistor 31 and $V_{OV}$ is an overdrive voltage of the bias transistor 31. The overdrive voltage $V_{OV}$ of the bias transistor 31 is normally negligible and will no longer be considered hereinafter, for this reason.

The bias transistor 31 and the cascode transistor 27 may have the same threshold voltage $V_{TN}$, since they match, and the decoding voltage $V_{DEC}$ on the column decoder 15 is balanced by equal voltage drop on the dummy resistor 32 of the reading column bias circuits 25. Thus, a bitline voltage $V_{BL}$ on the selected bitline 22 is:

$$V_{BL} = V_{GC} - V_{DEC} - V_{TN} = V_{RSEL} + V_{SAFE} \quad (2)$$

In equation 2, an overdrive voltage of the cascode transistor 27 has been neglected, since it is substantially the same as the overdrive voltage $V_{OV}$ of the bias transistor 31.

Accordingly, the bitline voltage $V_{BL}$ is fixed and is not subject to variations. The bitline voltage $V_{BL}$ is also given by:

$$V_{BL} = V_{CSEL} + V_{CELL} \quad (3)$$

where $V_{csel}$ is a cell select device voltage on the cell select device 13b of the selected cell 13. When the cell current $I_{CELL}$ flowing through the selected cell 13 equals the safe current $I_{SAFE}$, the cell select device voltage $V_{CSEL}$ is equal to the reference select device voltage $V_{RSEL}$. In other words, the reference select device voltage $V_{RSEL}$ is equal to the cell select device voltage $V_{CSEL}$ corresponding to the safe current $I_{SAFE}$.

So, in case a cell voltage $V_{CELL}$ greater than the safe voltage $V_{SAFE}$ is dropped across the phase change memory element 13a (e.g. on account of noise or wear of components), the cell select device voltage $V_{CSEL}$ is lower than the reference select device voltage $V_{RSEL}$. Accordingly, only a cell current $I_{CELL}$ lower than the safe current $I_{SAFE}$ is allowed by the cell select device 13b.

If, on the contrary, the cell current $I_{CELL}$ exceeds the safe current $I_{SAFE}$, the cell selector voltage $V_{CSEL}$ is greater than the reference selector voltage $V_{RSEL}$. Since the bitline voltage $V_{BL}$ is fixed, in this case the cell voltage $V_{CELL}$ falls below the safe voltage $V_{SAFE}$.

In either condition, at least one of the cell voltage $V_{CELL}$ and the cell current $I_{CELL}$ is lower than the respective safety parameter (i.e. the safe voltage $V_{SAFE}$ and the safe current $I_{SAFE}$). This assures that the outcome of reading operation is correct and is not affected by noise or other disturbs that may intervene.

Figure 4:
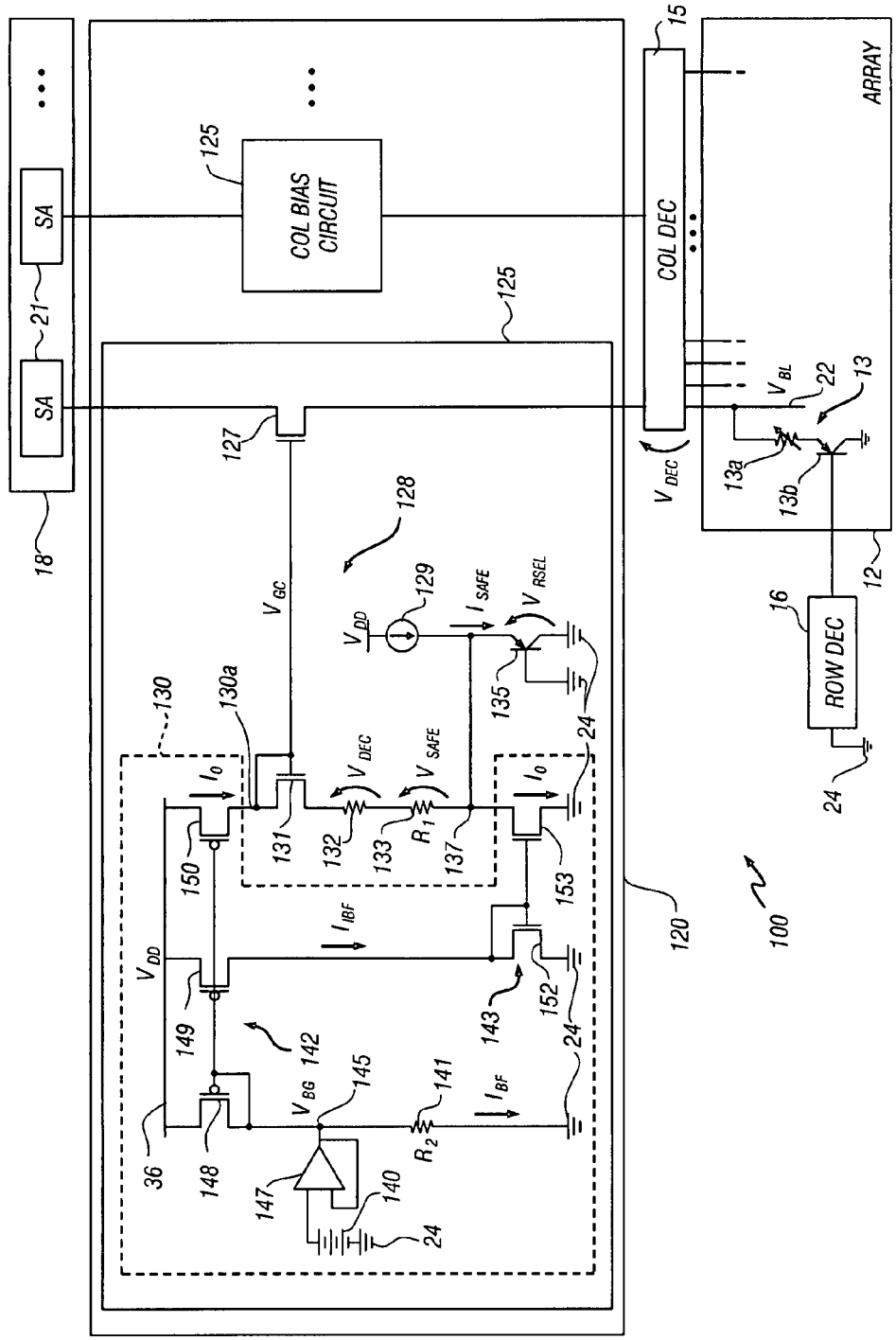
FIG. 4 is a hybrid circuit and block diagram of a phase change memory device according to a second embodiment of the present invention.

A second embodiment is illustrated in FIG. 4, where parts already shown are indicated by the same reference numbers. In this case, a phase change memory device 100 comprises the array 12 of PCM cells 13, the column decoder 15, the row decoder 16, the sense stage 18 and a reading column bias stage 120.

The reading column bias stage 120 includes a plurality of reading column bias circuits 125, coupled to a respective sense amplifiers 21. Each reading column bias circuit 125, one of which is illustrated in detail in FIG. 4, comprise a cascode transistor 127 and a voltage control circuit 128, for providing a controlled bias voltage $V_{GC}$ on a gate terminal of the cascode transistor 127. In the embodiment herein described, the cascode transistor 127 is a NMOS transistor and has its drain terminal connected to a respective sense amplifier 21 and source terminal connected to the column decoder 15 for coupling with an addressed bitline 22.

The voltage control circuit 128 comprises a first current source 129, a second current source 130, a diode-connected bias transistor 131, a dummy resistor 132, a reference resistor 133 and a reference selector 135.

The first current source 129 is connected to the voltage supply line 36 and is configured to supply a predetermined safe current $I_{SAFE}$ to an emitter terminal of the reference selector 135, that is connected to a reference node 137. Base and collector terminals of the reference selector 135 are connected to the ground line 24. The safe current $I_{SAFE}$ is selected so that if a read cell current $I_{CELL}$, that flows through an addressed cells 13 during reading operation, is lower than the safe current $I_{SAFE}$, reading is not affected by disturbs, whatever the read cell voltage $V_{CELL}$ dropping on the phase change memory element 13a of the addressed cells 13. In particular, phase transition of the phase change memory element 13a is prevented in any bias condition such that the read cell current $I_{CELL}$ is lower than the safe current $I_{SAFE}$, irrespective of the resistance level of the addressed cells 13.

The bias transistor 131, the dummy resistor 132 and the reference resistor 133 are connected in series between a supply terminal 130a of the second source 130 and the reference node 137. The second current source 130 provides a reference current $I_0$ at the supply terminal 130a and draws the same reference current $I_0$ from the reference node 137. In nominal temperature conditions, the reference current $I_0$ equals the safety current $I_{SAFE}$.

The bias transistor 131 may be an NMOS transistor designed to match the cascode transistor 127. The gate terminal of the bias transistor 131 provides the bias voltage $V_{GC}$ and is directly connected to the gate terminal of the cascode transistor 127.

A first resistance value $R_1$ of the reference resistor 133 is such that a predetermined safe voltage $V_{SAFE}$ dropped across it when the second current source 130 supplies the reference current $I_0$, independently of temperature variations. The safe voltage $V_{SAFE}$ is in turn selected so that if the read cell voltage $V_{CELL}$ that drops on the phase change memory element 13a of an addressed cells 13 during reading operation, is lower than the safe voltage $V_{SAFE}$, reading is not affected by disturbs, whatever the read cell current $I_{CELL}$ flowing through the addressed cells 13. In particular, phase transition of the phase change memory element 13a is prevented in any bias condition such that the read cell voltage $V_{CELL}$ is lower than the safety voltage $V_{SAFE}$, irrespective of the resistance level of the addressed cells 13.

The dummy resistor 132 is sized to balance the decoding voltage $V_{DEC}$ on the column decoder 15 and may be formed by as many series connected dummy transistors (not shown) as the decoding levels of the column decoder 15.

The second current source 130 comprises a band-gap voltage generator 140, a bias fixing resistor 141, a multiple-output PMOS current mirror 142 and a NMOS current mirror 143.

The band-gap voltage generator 140 supplies a band-gap voltage $V_{BG}$, that is constant and independent of temperature variations and is applied to a bias fixing node 145 by means of a buffer 147.

The bias fixing resistor 141 has a second resistance value $R_2$ and is connected between the bias fixing node 145 and the ground line 24.

The PMOS current mirror 142 comprises a PMOS sense transistor 148, a first PMOS mirror transistor 149 and a second PMOS mirror transistor 150, all having common gate terminals and source terminals connected to the voltage supply line 36. The drain terminal of the PMOS sense transistor 148 is connected to the bias fixing node 145, for sensing the current flowing through the bias fixing resistor 141. The drain terminal of the first PMOS mirror transistor 149 is coupled to the NMOS current mirror 143, whereas the drain terminal of the second PMOS mirror transistor 150 forms the supply terminal 130a of the second current source 130.

The NMOS current mirror 142 comprises a NMOS sense transistor 152 and a NMOS mirror transistor 153, which have common gate terminals and source terminals connected to the ground line 24. The drain terminals of the NMOS sense transistor 152 and of the NMOS mirror transistor 153 are connected to the drain terminal of the first PMOS transistor 149 and to the reference node 137, respectively. The reading column bias circuit 125 operates as follows. The first current source 129 and the reference selector 135 set the reference node 137 at a reference selector voltage $V_{RSEL}$. The reference selector voltage $V_{RSEL}$ is equal to a cell selector voltage $V_{CSEL}$ on the cell selector 13b of the selected memory cell when a cell current $I_{CELL}$ flowing therethrough is equal to the safe current $I_{SAFE}$. The safe current $I_{SAFE}$ flowing through the reference selector 135 is not affected by the connection of its emitter terminal to the reference node 137, because the same reference current $I_0$ is simultaneously injected into and drawn from the reference node 137 by the second current source 130.

The reference current $I_0$ supplied by the second current source 130 depends on temperature in such a way to compensate temperature dependence of the reference resistor 133 and to make the safe voltage $V_{SAFE}$ on the reference resistor 133 immune from temperature variations.

The reference current $I_0$ is in fact obtained by multiple mirroring of a bias fixing current $I_F$ flowing through the bias fixing resistor 141 on account of the band-gap voltage $V_{BG}$ applied to the bias fixing node 145.

Therefore, the bias fixing current $I_F$ is $$I_{BF}=V_{BG}/R_2 \quad (4)$$

and depends on temperature because it is determined by the second resistance value $R_2$ of the bias fixing resistor 141.

The bias fixing current $I_{BF}$ is sensed by the PMOS sense transistor 148 and mirrored by the first PMOS transistor 149 and by the second PMOS transistor 150, that respectively provide an intermediate bias fixing current $I_{IBF}$ and the reference current $I_0$ (both equal to the bias fixing current $I_{BF}$). The intermediate bias fixing current $I_{IBF}$ is in turn mirrored by the NMOS current mirror 143, that draws the reference current $I_0$ from the reference node 137.

Accordingly, the reference current $I_0$ and the safety voltage $V_{SAFE}$ on the reference resistor 133 is:

$$I_0=I_{IBF}=I_{BF}=V_{BG}/R_2 \quad (5b)$$

$$V_{SAFE}=R_1 I_0=V_{BG} R_1/R_2 \quad (5b)$$

Thus, temperature variations of the first resistance value $R_1$ are cancelled by temperature variations of the second resistance value $R_2$.

Therefore, appropriate bias conditions, with at least one of the cell voltage $V_{CELL}$ and the cell current $I_{CELL}$ lower than the respective parameter $V_{SAFE}$, $I_{SAFE}$, are met irrespective of temperature variations.

According to equation (2), that is in fact still valid, the bitline voltage $V_{BL}$ on the selected bitline 22 is determined by the safe voltage $V_{SAFE}$ and by the reference selector voltage $V_{RSEL}$ only. As explained above, the safe voltage $V_{SAFE}$ is not affected by temperature. In addition, the first current source 129 is temperature independent and therefore the safe current $I_{SAFE}$ is stable. Thus, although the reference selector voltage $V_{RSEL}$ may be affected in itself by temperature drift (as well as the cell selector voltage $V_{CSEL}$), at any time the reference selector 135 provides a correct reference to compensate cell currents $I_{CELL}$ exceeding the safe current $I_{SAFE}$.

Figure 5:
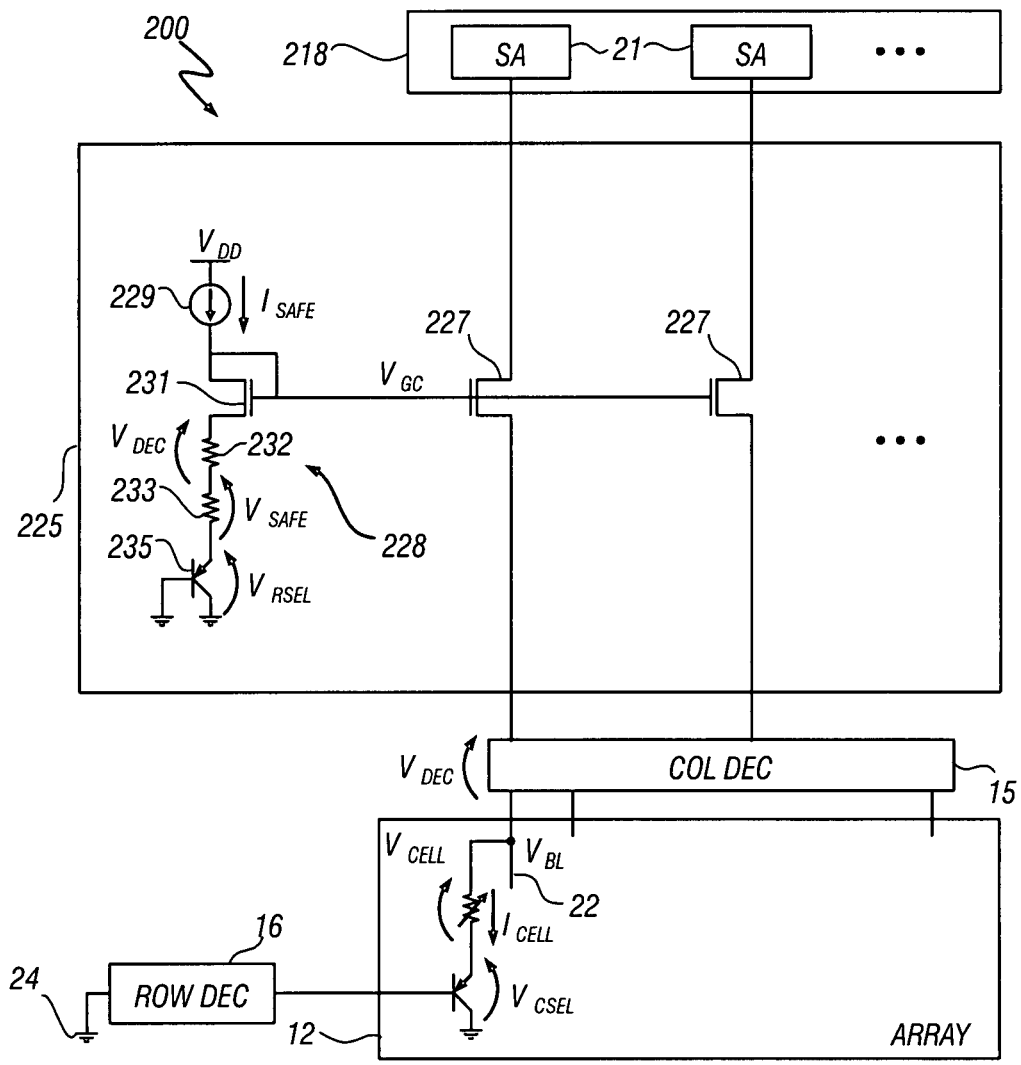
FIG. 5 is a hybrid circuit and block diagram of a phase change memory device according to a third embodiment of the present invention.

According to a third embodiment that is illustrated in FIG. 5, a phase change memory device 200 comprises the array 12 of cells 13, the column decoder 15, the row decoder 16, the sense stage 18 and a reading column bias circuit 225. The reading column bias circuit 225 comprises a voltage control circuit 228 and a plurality of cascode transistors 227, coupled to respective sense amplifiers 21.

The voltage control circuit 228 has the same structure as the voltage control circuit 28 of FIG. 2 and comprises a voltage source 229, a bias transistor 231, a dummy resistor 232, a reference resistor 233 and a reference selector 235. Hence, a bias voltage $V_{GC}$ according to equation (1) is provided on a gate terminal of the bias transistor 231.

In one embodiment not shown, the voltage control circuit 228 has the same structure as the voltage control circuit 128 of FIG. 4.

The N-type cascode transistors 227 have drain terminals connected to respective sense amplifiers 21 and source terminals connected to the column decoder 15, for coupling with addressed bitlines 22 during read operations. Gate terminals of the cascode transistors 227 are all connected to the gate terminal of the bias transistor 231, for receiving the bias voltage $V_{GC}$. A reduction of circuit dimension may be achieved in some embodiments.

In one embodiment (FIG. 6), a reading column bias circuit 325 comprises a voltage control circuit 328 and at least one cascode transistor 327 coupled thereto. An array of N parallel-connected reference resistors 333 is used in the voltage control circuit 328 in place of a single reference resistor and is connected to a voltage source 329, that provides the safe current $I_{SAFE}$, a bias transistor 331, a dummy resistor 332 and to a reference selector 335. An overall resistance value of the array of reference resistors 333 is such that the safe voltage $V_{SAFE}$ drops on it when the safe current $I_{SAFE}$ is provided by the bias transistor 331. Sensitivity to process spread may be reduced in some embodiments.

In another embodiment (FIG. 7), a reading column bias circuit 425 comprises a voltage control circuit 428 and at least one cascode transistor 427 coupled thereto. The voltage control circuit 428 in turn comprises a voltage source 429, a bias transistor 431, a dummy resistor 432, a reference resistor 433 and an array of N parallel-connected reference selectors 435, each of which is configured to draw the safe current $I_{SAFE}$. In this case, an overall current equal to $NI_{SAFE}$ is provided by the current source 429 and flows through the reference resistor 433, that is designed to cause a voltage drop equal to $V_{SAFE}$. In other words, a resistance value of the reference resistor 433 is $R=V_{SAFE}/NI_{SAFE}$.

In FIG. 8, a portion of a system 500 in accordance with an embodiment of the present invention is illustrated. System 500 may be used in devices such as, for example, a personal digital assistant (PDA), a laptop or portable computer, possibly with wireless capability, a cellphone, a messaging device, a digital music player, a digital camera, or other devices that may be adapted to process, store, transmit or receive information and require permanent storage capability.

System 500 may include a controller 510, an input/output (I/O) device 520 (e.g. a keyboard, display), the phase change memory device 10, a wireless interface 540, and a RAM memory 560, coupled to each other via a bus 550. A battery 580 may be used to supply power to the system 500 in one embodiment. It should be noted that the scope of the present invention is not limited to embodiments having necessarily any or all of above listed components.

Controller 510 may comprise, for example, one or more microprocessors, digital signal processors, micro-controllers, or the like.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or as analog information (if analog information was stored).

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory device comprising:
a cell including a phase change memory element and a select device; and
a reading bias circuit to supply a cell voltage equal to a voltage on the select device when a cell current is equal to a safe current and wherein a safe voltage and the safe current are such that phase transition of the phase change memory element is prevented in any bias condition.

2. The device of claim 1 wherein the reading column bias circuit comprises a reference resistor, a reference select device, matching the cell select devices and a current generator circuit to supply current to the reference resistor and the reference select device such that the safe voltage drops across the reference resistor and the safe current flows through the reference select device.

3. The device of claim 2 wherein the reading column bias circuit further comprises a cascode transistor and a bias transistor having control terminals connected together and wherein the cascode transistor has a conduction terminal coupled to the addressed bitline and the bias transistor has a conduction terminal coupled to the reference resistor.

4. The device of claim 3 including an addressing circuit, wherein the reading column bias circuit further comprises a dummy resistive element to compensate a decoding voltage drop across the addressing circuit.

5. The device of claim 3 wherein the bias transistor, the reference resistor, and the reference select devices are series-connected.

6. The device of claim 5 wherein the current generator circuit comprises a current source to supply the safe current to the bias transistor, the reference resistor, and the reference select device.

7. The device of claim 3 wherein the bias transistor and the reference resistor are series-connected and the reference select device has a conduction terminal connected to the reference resistor.

8. The device of claim 7 wherein the current generator circuit comprises a first current source to supply the safe current to the reference select device, and a second current source to supply a temperature-compensated reference current to the reference resistor to compensate temperature dependence of the reference resistor.

9. The device of claim 8 wherein the second current source comprises:
a bias fixing resistor;
a temperature-independent voltage source to provide a temperature-independent voltage across the bias fixing resistor; and
current mirror circuits to mirror a current flowing through the bias fixing resistor and supply the reference current to the reference resistor.

10. The device of claim 9 wherein the current mirror circuits comprise a first current mirror to inject the reference current into the reference resistor and a second current mirror to draw the reference current from the reference resistor.

11. A system comprising:
a processor; and
a phase change memory device coupled to said processor, said device comprising a cell including a phase change memory element and a select device, and a cell voltage equal to a voltage on the select device when a cell current is equal to a safe current and wherein a safe voltage and the safe current are such that phase transition of the phase change memory element is prevented in any bias condition.

12. The system of claim 11 wherein the reading bias circuit comprises a reference resistor, a reference select device, matching the select device and a current generator circuit to supply current to the reference resistor and the reference select devices such that the safe voltage drops across the reference resistor and the safe current flows through the reference select device.

13. The system of claim 12 wherein the reading column bias circuit further comprises a cascode transistor and a bias transistor having control terminals connected together and wherein the cascode transistor has a conduction terminal coupled to the addressed bitline and the bias transistor has a conduction terminal coupled to the reference resistor.

14. A method comprising:
biasing a phase change memory cell including a select device and memory element with a cell voltage equal to a voltage on the select device when a cell current is equal to a safe current and wherein a safe voltage and the safe current arc such that phase transition of the phase change memory element is prevented in any bias condition.

15. The method of claim 14 wherein biasing comprises:
providing a reference resistor and a reference select device, matching the select device; and
supplying current to the reference resistor and the reference select device such that the safe voltage drops across the reference resistor and the safe current flows through the reference select device.

16. The method of claim 15 including connecting the reference resistor and the reference select device in series, wherein biasing includes supplying the safe current to the reference resistor and the reference select device.

17. The method of claim 15 wherein biasing comprises:
supplying the safe current to the reference select device; and
supplying a temperature-compensated reference current to the reference resistor to compensate temperature dependence of the reference resistor.

18. The method of claim 17 wherein supplying the safe current comprises:
applying a temperature-independent voltage across a bias fixing resistor; and
mirroring a current flowing through the bias fixing resistor to supply the reference current to the reference resistor.

19. The method of claim 18 wherein supplying the safe current comprises injecting the reference current into the reference resistor and drawing the reference current from the reference resistor.

* * * * *

UNITED STATES PATENT AND TRADEMARK OFFICE
CERTIFICATE OF CORRECTION

| | |
|---|---|
| PATENT NO. | : 7,848,138 B2 |
| APPLICATION NO. | : 11/809702 |
| DATED | : December 7, 2010 |
| INVENTOR(S) | : Ferdinando Bedeschi et al. |

Page 1 of 1

It is certified that error appears in the above-identified patent and that said Letters Patent is hereby corrected as shown below:

Column 7:
Line 65, "the reading column bias" should be --the reading bias--;
Line 67, "matching the cell select" should be --matching the select--;

Column 8:
Line 5, "the reading column bias" should be --the reading bias--;

Column 9:
Line 6, "arc" should be --are--.

Signed and Sealed this
Fourteenth Day of June, 2011

David J. Kappos
*Director of the United States Patent and Trademark Office*